(12) United States Patent
Droz et al.

(10) Patent No.: US 11,677,398 B2
(45) Date of Patent: *Jun. 13, 2023

(54) SYSTEMS AND METHODS FOR SELECTING LIGHT EMITTERS FOR EMITTING LIGHT

(71) Applicant: Waymo LLC, Mountain View, CA (US)

(72) Inventors: Pierre-yves Droz, Los Altos, CA (US); Augusto Tazzoli, San Jose, CA (US); Michael Marx, Mountain View, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/583,873

(22) Filed: Jan. 25, 2022

(65) Prior Publication Data
US 2022/0146629 A1 May 12, 2022

Related U.S. Application Data

(63) Continuation of application No. 17/039,940, filed on Sep. 30, 2020, now Pat. No. 11,368,153, which is a
(Continued)

(51) Int. Cl.
*G01S 7/481* (2006.01)
*G01S 7/484* (2006.01)
(Continued)

(52) U.S. Cl.
CPC ..... *H03K 17/969* (2013.01); *H03K 17/04123* (2013.01); *H05B 45/00* (2020.01)

(58) Field of Classification Search
None
See application file for complete search history.

(56) References Cited

U.S. PATENT DOCUMENTS 6,057,910 A   5/2000   Dunne
6,847,169 B2   1/2005   Ito et al.
(Continued)

OTHER PUBLICATIONS

International Search Report and Written Opinion, dated Mar. 23, 2021, in International Patent Application No. PCT/US2020/062536.
(Continued)

*Primary Examiner* — Kenneth B Wells
(74) *Attorney, Agent, or Firm* — McDonnell Boehnen Hulbert & Berghoff LLP

(57) ABSTRACT

An example circuit includes a plurality of light emitters connected in parallel between a first node and a second node. The circuit also includes a plurality of capacitors, with each capacitor corresponding to one of the light emitters, and a plurality of discharge-control switches, with each discharge-control switches corresponding to one of the capacitors. The circuit further includes a pulse-control switch connected to the plurality of light emitters. During a first period, the pulse-control switch restricts current flow, and each of the plurality of capacitors is charged via the first node. During a second period, one or more of the plurality of discharge-control switches allows current flow that discharges one or more corresponding capacitors. During a third period, the pulse-control switch allows current flow that discharges one or more undischarged capacitors of the plurality of capacitors through one or more corresponding light emitters.

20 Claims, 8 Drawing Sheets

Related U.S. Application Data continuation of application No. 16/699,438, filed on Nov. 29, 2019, now Pat. No. 10,797,698.

(51) Int. Cl.

| | | |
|---|---|---|
| *G01S 7/486* | (2020.01) |
| *G01S 17/02* | (2020.01) |
| *G01S 17/10* | (2020.01) |
| *G01S 17/42* | (2006.01) |
| *H03K 17/969* | (2006.01) |
| *H03K 17/0412* | (2006.01) |
| *H05B 45/00* | (2022.01) |

(56) References Cited

U.S. PATENT DOCUMENTS

| | | |
|---|---|---|
| 7,180,921 B2 | 2/2007 | Mangano et al. |
| 7,733,034 B2 | 6/2010 | Kotikalapoodi et al. |
| 8,115,913 B2 | 2/2012 | Komamaki |
| 8,669,934 B2 | 3/2014 | Sasaki |
| 8,749,163 B2 | 6/2014 | Phadke |
| 8,917,029 B2 | 12/2014 | Chu et al. |
| 9,035,567 B2 | 5/2015 | Sakuragi et al. |
| 9,300,113 B2 | 3/2016 | Hoffman et al. |
| 9,614,452 B2 | 4/2017 | Jin et al. |
| 9,655,174 B2 | 5/2017 | Qu et al. |
| 9,853,545 B2 | 12/2017 | Wyland |
| 9,860,946 B2 | 1/2018 | LoCascio |
| 9,985,415 B2 | 5/2018 | Tokuda et al. |
| 10,007,000 B1 | 6/2018 | Droz et al. |
| 10,031,214 B2 | 7/2018 | Rosenzweig et al. |
| 10,048,358 B2 | 8/2018 | Berger et al. |
| 10,158,211 B2 | 12/2018 | Barnes et al. |
| 10,222,475 B2 | 3/2019 | Pacala et al. |
| 10,256,605 B2 | 4/2019 | Gassend et al. |
| 10,277,007 B1 | 4/2019 | Lenius et al. |
| 10,359,507 B2 | 7/2019 | Berger et al. |
| 10,797,698 B1 | 10/2020 | Droz et al. |
| 11,368,153 B2 * | 6/2022 | Droz ................... H05B 47/115 |
| 2013/0105670 A1 | 5/2013 | Borosak |
| 2014/0063593 A1 | 3/2014 | Berendt |
| 2017/0005465 A1 | 1/2017 | Wyland et al. |
| 2017/0070029 A1 | 3/2017 | Moeneclaey et al. |
| 2019/0045595 A1 | 2/2019 | Johnsen et al. |
| 2019/0191527 A1 | 6/2019 | Rock et al. |
| 2019/0215921 A1 | 7/2019 | Wojcik et al. |

OTHER PUBLICATIONS

"A Laser Pulser for a TOF Laser Radar"; Ari Kilpela, et al. (Sep. 25, 1997).

EGaN FETs for Lidar—Getting the Most out of the EPC9126 Laser Driver; John S. Glaser; EPC—Power Conversion Technology Leader (Feb. 5, 2019).

* cited by examiner

SYSTEMS AND METHODS FOR SELECTING LIGHT EMITTERS FOR EMITTING LIGHT

CROSS-REFERENCE TO RELATED APPLICATIONS

The present application is a continuation application claiming priority to U.S. patent application Ser. No. 17/039,940, filed Sep. 30, 2020 and issued as U.S. Pat. No. 11,368,153 on Jun. 21, 2022; which itself claims priority to U.S. patent application Ser. No. 16/699,438, filed Nov. 29, 2019 and issued as U.S. Pat. No. 10,797,698 on Oct. 6, 2020, the contents of each of which are hereby incorporated by reference in their entirety.

BACKGROUND

Unless otherwise indicated herein, the materials described in this section are not prior art to the claims in this application and are not admitted to be prior art by inclusion in this section.

A Light Detection and Ranging (LIDAR) device is used for sensing aspects of an environment. A plurality of light emitters emit light to an environment surrounding the device, and a plurality of light detectors detect reflected light. Based on time differences between light emissions and receiving the reflected light, the LIDAR device can generate three-dimensional (3D) point cloud data that can be interpreted to render a representation of the environment.

Conditions might exist where it is desirable to sense some portions of the environment but not others. For example, reflections from some objects in the environment (e.g., retroreflectors) might interfere with sensing neighboring portions of the environment.

SUMMARY

In a first example, a circuit is provided. The circuit includes a plurality of light emitters connected in parallel between a first node and a second node. The circuit includes a plurality of capacitors, wherein each capacitor in the plurality of capacitors corresponds to a respective light emitter in the plurality of light emitters. The circuit includes a plurality of discharge-control switches, wherein each discharge-control switch corresponds to a respective capacitor in the plurality of capacitors. The circuit includes a pulse-control switch connected to the plurality of light emitters. During a first period, the pulse-control switch restricts current flow and each capacitor in the plurality of capacitors is charged via the first node. During a second period, one or more of the plurality of discharge-control switches allows current flow that discharges one or more corresponding capacitors of the plurality of capacitors. During a third period, the pulse-control switch allows current flow that discharges one or more undischarged capacitors of the plurality of capacitors through one or more corresponding light emitters of the plurality of light emitters, thereby causing the one or more corresponding light emitters to emit respective pulses of light.

In a second example, a method is provided. The method includes, during a first period, (i) using a pulse-control switch to restrict current flow through a plurality of light emitters, and (ii) charging a plurality of capacitors via a first node. The method includes, during a second period, using one or more discharge-control switches to allow current flow that discharges one or more corresponding capacitors of the plurality of capacitors. The method includes, during a third period, using the pulse-control switch to allow current flow and thereby discharge one or more undischarged capacitors of the plurality of capacitors through one or more corresponding light emitters of the plurality of light emitters, thereby causing the one or more corresponding light emitters to emit respective pulses of light.

In a third example, a non-transitory computer readable medium is provided. The non-transitory computer readable medium has instructions stored thereon that when executed by a processor cause performance of a set of functions. The set of functions includes, during a first period, (i) using a pulse-control switch to restrict current flow through a plurality of light emitters, and (ii) charging a plurality of capacitors via a first node. The set of functions includes, during a second period, using one or more discharge-control switches to allow current flow that discharges one or more corresponding capacitors of the plurality of capacitors. The set of functions includes, during a third period, using the pulse-control switch to allow current flow and thereby discharge one or more undischarged capacitors of the plurality of capacitors through one or more corresponding light emitters of the plurality of light emitters, thereby causing the one or more corresponding light emitters to emit respective pulses of light.

In a fourth example, a method for scanning an environment of an autonomous vehicle is provided. The method may include determining portions of the environment that may include retroreflectors. The method may further include selectively disabling capabilities of a LIDAR to scan those portions. The method may further include scanning other portions of the of the environment with the LIDAR. Selectively disabling capabilities of the LIDAR to scan those portions may include selectively preventing the LIDAR from transmitting light to those portions of the environment that may include retroreflectors. Selectively preventing the LIDAR from transmitting light to those portions of the environment that may include retroreflectors may include selectively preventing one or more transmitters (e.g., light emitters, such as laser diodes) from emitting light at a certain time.

These as well as other aspects, advantages, and alternatives will become apparent to those of ordinary skill in the art by reading the following detailed description with reference where appropriate to the accompanying drawings. Further, it should be understood that the description provided in this summary section and elsewhere in this document is intended to illustrate the claimed subject matter by way of example and not by way of limitation.

DETAILED DESCRIPTION

Figure 1A:
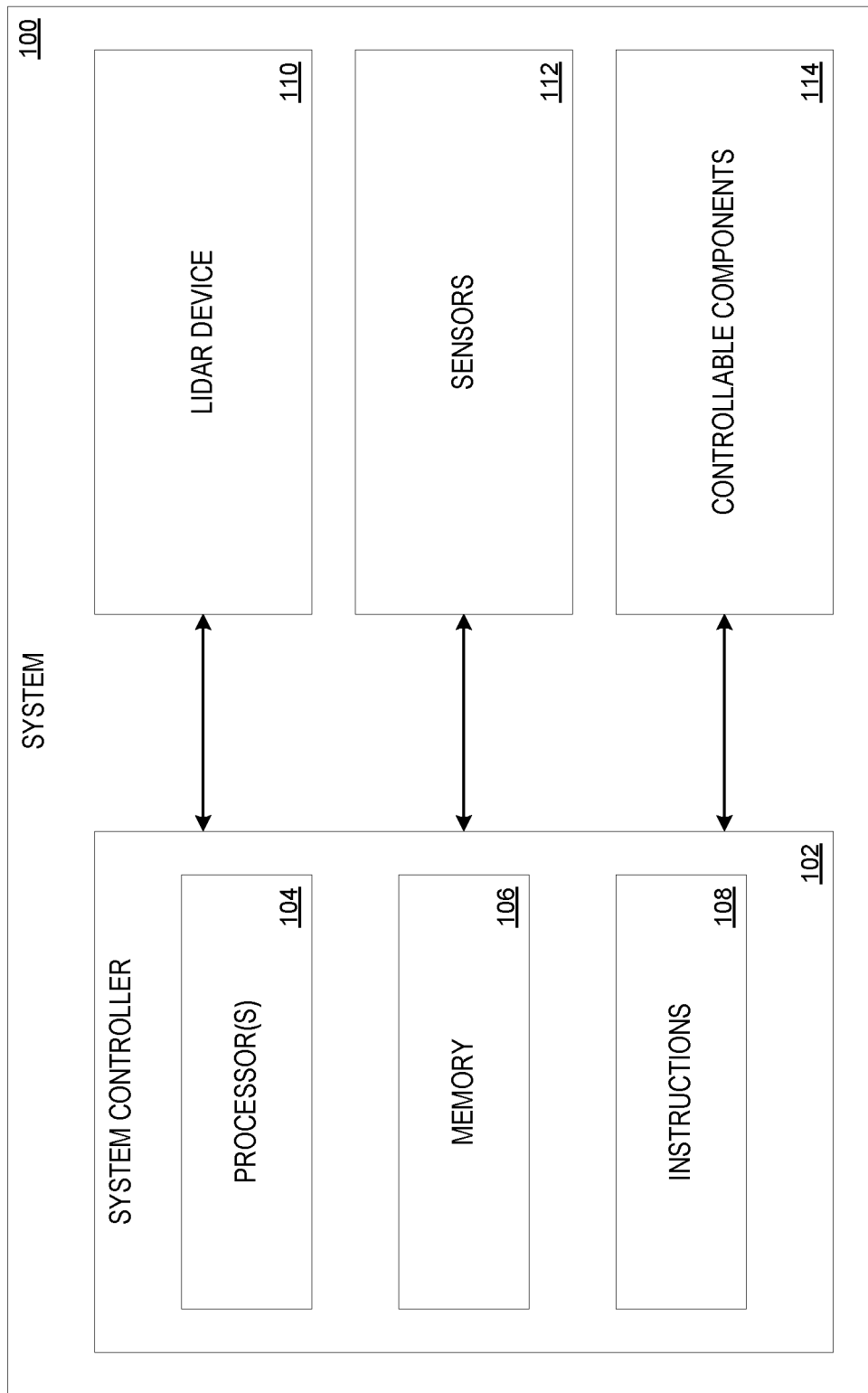
FIG. 1A is a block diagram of a system including a LIDAR device, according to an example embodiment.

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting. Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

By the term "about" or "substantially" with reference to amounts or measurement values described herein, it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

I. Overview

A LIDAR device can include one or a plurality of light emitters that can emit pulses of light. For example, the light emitter may be a laser diode. A selector circuit circuit can be used to select which of the light emitters are used to emit light and which are not. For example, it may be desirable that one or more of the light emitters are not used to emit light in order to avoid illuminating retroreflectors or other highly-reflective surfaces. Such surfaces may flood light detectors on the LIDAR device with reflected portions of light emitted from the light emitters and thus impede aspects of representing the received reflected portions of light and interpreting resulting data. For example, this may introduce ambiguity in determining 3D point cloud data or may bias data-processing operations that use the 3D point cloud data, such as edge-detection or object detection operations.

In an example embodiment, the pulser circuit includes a plurality of laser diodes that are connected in parallel. For example, the laser diodes could all have a common cathode (e.g., a device may include eight laser diode bars with a common cathode), or the cathodes of the laser diodes could be connected together at a cathode node. The common cathode or cathode node is connected to the drain of a pulse-control switch (e.g., a transistor, such as a GaNFET or other type of field-effect transistor, a bipolar transistor, a control switch, a limit switch, or another type of switching device configured to alternatively allow or stop current flow in a circuit). For example, the pulse-control switch may be a pulse-control transistor. In such examples, the source of the pulse-control transistor is connected to ground. The gate of the pulse-control transistor is connected to a driver circuit. The anode of each laser diode is connected to the cathode of a respective charging diode, a respective capacitor, and a respective discharge-control switch. The pulser circuit further includes an inductor. One end of the inductor is connected to an adjustable voltage source. The other end of the inductor is connected to the anodes of the charging diodes.

The pulser circuit can be operated in accordance with a repeating pulse period, each pulse period corresponding to emissions of light from the light emitters. Each pulse period, in turn, can include a first period (i.e., a charging period), a second period (i.e., a selective discharge period), and a third period (i.e., a pulse emission period). During the charging period, the pulse-control switch is off, all of the discharge-control switches are off, and the voltage source is turned on. The voltage source causes a current to flow through the inductor, which charges each of the capacitors through their associated charging diodes. During the selective discharge period, one or more of the discharge-control switches are turned on, thereby discharging the associated capacitors. During the pulse emission period, the pulse-control switch is turned on, which causes the capacitors that have not already been discharged to discharge through their associated laser diodes and the pulse-control switch. As a result, a discharge current flows through each laser diode that has not had its associated capacitor discharged during the selective discharge period, thereby causing each such laser diode to emit a pulse of light.

In some examples, a shift register is used to control the discharge-control switches. For example, the discharge-control switches can be transistors or other switching devices. Accordingly, as referred to herein, the term functionality described with respect to a "discharge-control transistor" can also be achieved using other types of switching devices, such as switches. In this approach, the shift register is loaded with data (e.g., N bits of data for N laser diodes, or N bits of data for $2^N$ switches, depending on the encoding of the shift register), with each bit of data determining whether the discharge-control switch for a particular laser diode is to be turned on during the selective discharge period or remain off. For example, a "1" may indicate that a discharge-control switch is to be turned on and a "0" may indicate that a discharge-control switch is to remain off, or vice versa. The outputs of the shift register are connected to the gates of the discharge-control switches, and thereby select which capacitors to discharge during the selective discharge period, and by proxy, select which capacitors that remain charged and are capable of discharging during the pulse emission period.

In some examples, the adjustable voltage source can be controlled to apply different voltages to the inductor. For example, in a default mode of operation, the adjustable voltage source may be controlled to apply a voltage V1 to the inductor, which causes each of the capacitors to charge up to a voltage of Vcap1 (e.g., Vcap1 could be about 2×V1). When the capacitors discharge through their respective laser diodes, the emitted light pulses may have a first peak power level. However, for short periods of time (e.g., based on thermal constraints), the adjustable voltage source may be controlled to apply a voltage V2 to the inductor in which V2>V1. This causes the capacitors to charge up to a higher voltage, Vcap2 (e.g., Vcap2 could be about 2×V2). And, when the capacitors discharge through their respective laser diodes, the emitted light pulses may have a second, higher peak power level. Controlling the voltage levels of the capacitors may alternatively or additionally involve applying a voltage for a period of time associated with charging the capacitor (i.e., a "charging period"). For example, a desired power level of a light pulse can be determined that is associated with a charge level of the capacitors. The capacitors may be charged for a period of time (e.g., based on a known capacitance of the capacitors and the applied voltage) associated with the power level. In this manner, a power level of each light pulse can be precisely controlled by setting the charging period for the capacitors. Additionally or alternatively, each charged capacitor can be discharged by a predetermined amount prior to the emission period to achieve a desired voltage level and thereby control a power level of each light pulse.

II. Example Systems

FIG. 1A is a block diagram of a system including a LIDAR device, according to an example embodiment. In particular, FIG. 1A shows a system 100 that includes a system controller 102, a LIDAR device 110, a plurality of sensors 112, and a plurality of controllable components 114. System controller 102 includes processor(s) 104, a memory 106, and instructions 108 stored on the memory 106 and executable by the processor(s) 104 to perform functions.

The processor(s) 104 can include on or more processors, such as one or more general-purpose microprocessors and/or one or more special purpose microprocessors. The one or more processors may include, for instance, an application-specific integrated circuit (ASIC) or a field-programmable gate array (FPGA). Other types of processors, computers, or devices configured to carry out software instructions are contemplated herein.

The memory 106 may include a computer readable medium, such as a non-transitory computer readable medium, which may include without limitation, read-only memory (ROM), programmable read-only memory (PROM), erasable programmable read-only memory (EPROM), electrically erasable programmable read-only memory (EEPROM), non-volatile random-access memory (e.g., flash memory), a solid state drive (SSD), a hard disk drive (HDD), a Compact Disc (CD), a Digital Video Disk (DVD), a digital tape, read/write (R/W) CDs, R/W DVDs, etc.

The LIDAR device 110, described further below, includes a plurality of light emitters configured to emit light (e.g., in light pulses) and light detectors configured to detect light (e.g., reflected portions of the light pulses). The LIDAR device 110 may generate 3D point cloud data from outputs of the light detectors, and provide the 3D point cloud data to the system controller 102. The system controller 102, in turn, may perform operations on the 3D point cloud data to determine the characteristics of an environment (e.g., relative positions of objects within an environment, edge detection, object detection, proximity sensing, or the like).

Similarly, the system controller 102 may use outputs from the plurality of sensors 112 to determine the characteristics of the system 100 and/or characteristics of the environment. For example, the sensors 112 may include one or more of a Global Positioning System (GPS), an Inertial Measurement Unit (IMU), an image capture device (e.g., a camera), a light sensor, a heat sensor, and other sensors indicative of parameters relevant to the system 100 and/or the environment). The LIDAR device 110 is depicted as separate from the sensors 112 for purposes of example, and may be considered a sensor in some examples.

Based on characteristics of the system 100 and/or the environment determined by the system controller 102 based on the outputs from the LIDAR device 110 and the sensors 112, the system controller 102 may control the controllable components 114 to perform one or more actions. For example, the system 100 may correspond to a vehicle, in which case the controllable components 114 may include a braking system, a turning system, and/or an accelerating system of the vehicle, and the system controller 114 may change aspects of these controllable components based on characteristics determined from the LIDAR device 110 and/or sensors 112 (e.g., when the system controller 102 controls the vehicle in an autonomous mode). Within examples, the LIDAR device 110 and the sensors 112 are also controllable by the system controller 102.

Figure 1B:
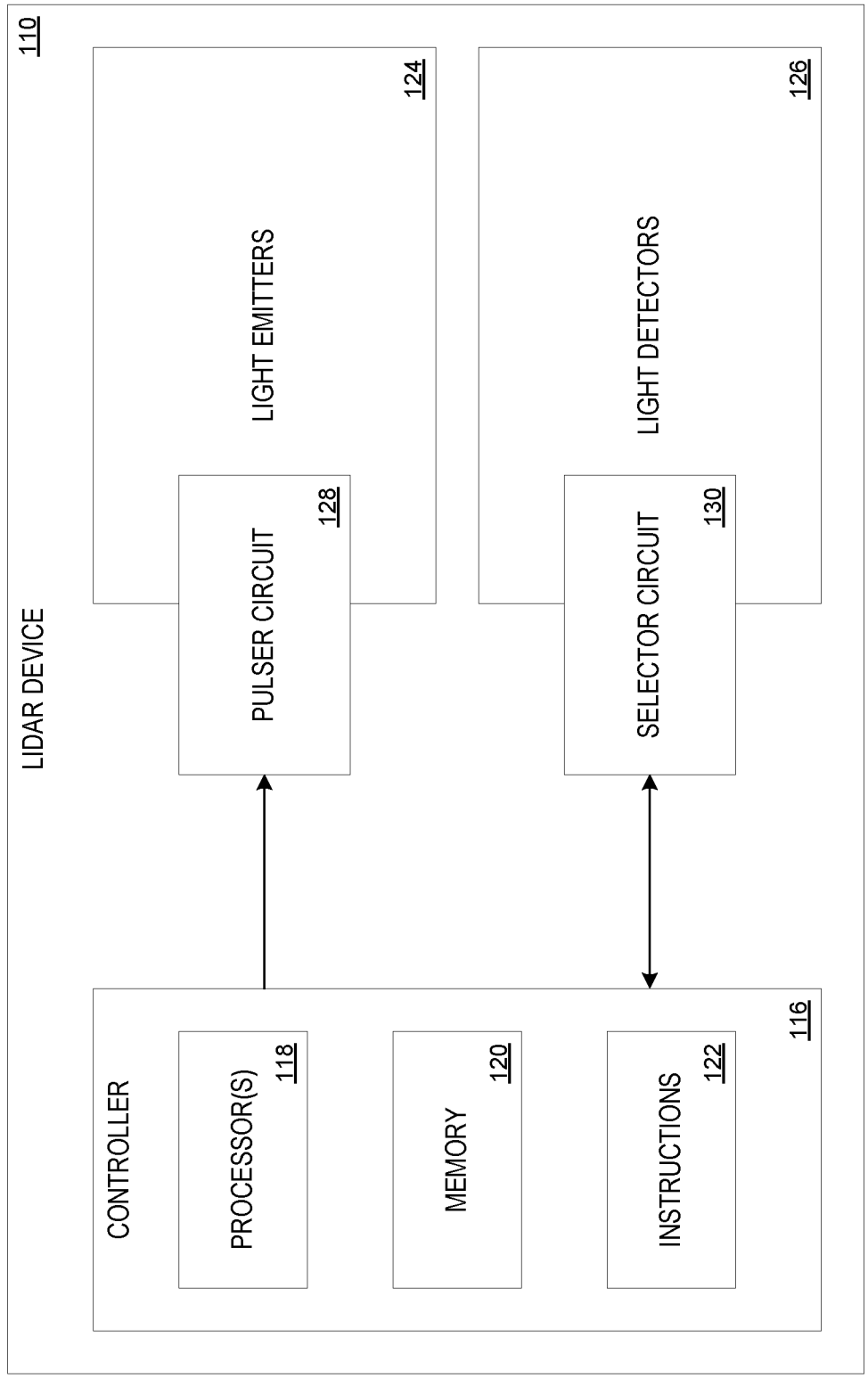
FIG. 1B is a block diagram of a LIDAR device, according to an example embodiment.

FIG. 1B is a block diagram of a LIDAR device, according to an example embodiment. In particular, FIG. 1B shows a LIDAR device 110, having a controller 116 configured to control a plurality of light emitters 124 and a plurality of light detectors 126. The LIDAR device 110 further includes a pulser circuit 128 configured to select and provide power to respective light emitters of the plurality of light emitters 124 and a selector circuit 130 configured to select respective light detectors of the plurality of light detectors 126. The controller 116 includes processor(s) 118, a memory 120, and instructions 122 stored on the memory 120.

Similar to processor(s) 104, the processor(s) 118 can include one or more processors, such as one or more general-purpose microprocessors and/or one or more special purpose microprocessors. The one or more processors may include, for instance, an application-specific integrated circuit (ASIC) or a field-programmable gate array (FPGA). Other types of processors, computers, or devices configured to carry out software instructions are contemplated herein.

Similar to memory 106, the memory 120 may include a computer readable medium, such as a non-transitory computer readable medium, such as, but not limited to, read-only memory (ROM), programmable read-only memory (PROM), erasable programmable read-only memory (EPROM), electrically erasable programmable read-only memory (EEPROM), non-volatile random-access memory (e.g., flash memory), a solid state drive (SSD), a hard disk drive (HDD), a Compact Disc (CD), a Digital Video Disk (DVD), a digital tape, read/write (R/W) CDs, R/W DVDs, etc.

The instructions 122 are stored on memory 120 and executable by the processor(s) 118 to perform functions related to controlling the pulser circuit 128 and the selector circuit 130, for generating 3D point cloud data, and for processing the 3D point cloud data (or perhaps facilitating processing the 3D point cloud data by another computing device, such as the system controller 102).

The controller 116 can determine 3D point cloud data by using the light emitters 124 to emit pulses of light. A time of emission is established for each light emitter and a relative location at the time of emission is also tracked. Aspects of an environment of the LIDAR device 110, such as various objects, reflect the pulses of light. For example, when the LIDAR device 110 is in an environment that includes a road, such objects may include vehicles, signs, pedestrians, road surfaces, construction cones, or the like. Some objects may be more reflective than others, such that an intensity of reflected light may indicate a type of object that reflects the light pulses. Further, surfaces of objects may be at different positions relative to the LIDAR device 110, and thus take more or less time to reflect portions of light pulses back to the LIDAR device 110. Accordingly, the controller 116 may track a detection time at which a reflected light pulse is detected by a light detector and a relative position of the light detector at the detection time. By measuring time differences between emission times and detection times, the controller 116 can determine how far the light pulses travel prior to being received, and thus a relative distance of a corresponding object. By tracking relative positions at the emission times and detection times the controller 116 can determine an orientation of the light pulse and reflected light pulse relative to the LIDAR device 110, and thus a relative orientation of the object. By tracking intensities of received light pulses, the controller 116 can determine how reflective the object is. The 3D point cloud data determined based on this information may thus indicate relative positions of detected reflected light pulses (e.g., within a coordinate system, such as a Cartesian coordinate system) and intensities of each reflected light pulse.

As described further below, the pulser circuit 128 is used for selecting light emitters for emitting light pulses. The selector circuit 130 similarly is used for sampling outputs from light detectors.

Figure 2:
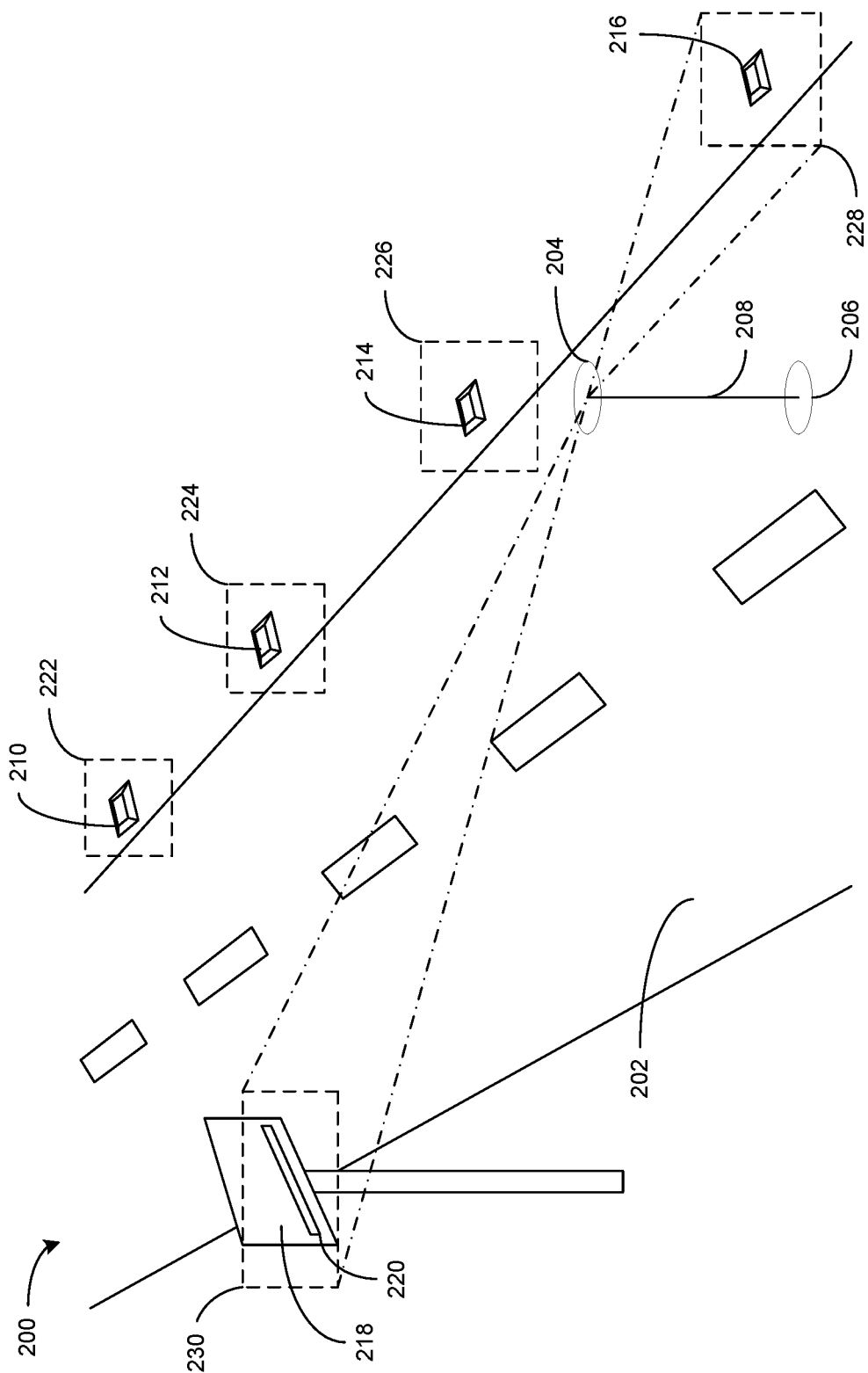
FIG. 2 illustrates an environment of a LIDAR device, according to an example embodiment.

FIG. 2 illustrates an environment of a LIDAR device, according to an example embodiment. In particular, FIG. 2 shows an environment 200 that includes a road 202, a LIDAR device (which is indicated schematically by a detection plane 204), and a plurality of objects. The LIDAR device may be the same or similar to the LIDAR device 110. The detection plane 204 is a simplified representation of the LIDAR device because, in practice, the LIDAR device may detect reflected portions of light pulses at multiple heights and angles. The LIDAR device is positioned at a height 208 relative to a road surface 206. In this context, the road 202 may be considered an object. The objects in the environment 200 further include retroreflectors 210, 212, 214, and 216. The objects further include sign 218, which includes a retroreflective strip 220.

The LIDAR device (or a controller thereof) may avoid emitting light towards retroreflective materials. For example, in a first scan at or near to the detection plane 204, the LIDAR device may detect clusters of high-intensity reflections (e.g., 95% or more of an emitted light pulse intensity). During a second scan, the LIDAR device may cause light emitters to scan a first portion of the environment and not scan a second portion. The second portion may include regions 222, 224, 226, 228, and 230. By avoiding these areas, the LIDAR device reduces the likelihood of receiving high-intensity reflections from these regions. The LIDAR device may determine positions and times of light emissions that would illuminate these regions based on orientations and distances of received reflections relative to the detection plane 204. Within other examples, a separate computing device (e.g., the system controller 102) may perform these functions.

After determining which regions of the environment 200 to avoid illuminating, the LIDAR device selects light emitters for emitting light, and selects light emitters for not emitting light. In examples where only a single light emitter is used for emitting light (e.g., where an adjustable mirror is used in conjunction with a single light emitter to generate multiple light beams that are emitted into the environment) timing of the single light emitter or actions of a coordinating member (e.g., movement of an adjustable mirror) can be adjusted to emit light to some portions of an environment but not others. Further description of this is provided below with respect to FIGS. 3A-3D.

Figure 3A:
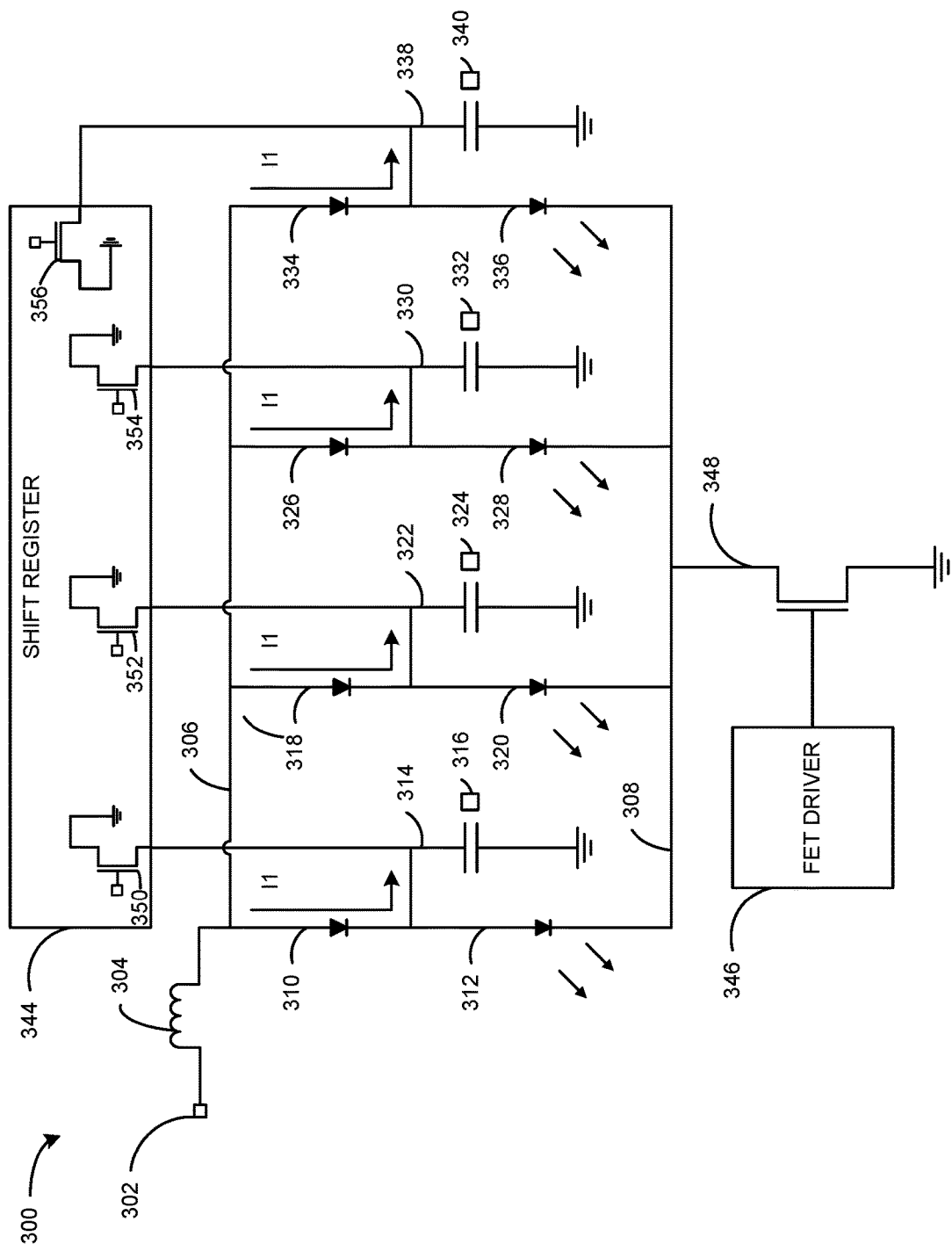
FIG. 3A illustrates a pulser circuit of a LIDAR device at a first time, according to an example embodiment.

FIG. 3A illustrates a pulser circuit of a LIDAR device at a first time, according to an example embodiment. In particular, FIG. 3A shows a pulser circuit 300 that includes a voltage source node 302 that can be connected to a voltage source (not depicted). For example, the voltage source may be an adjustable voltage source. The voltage source node 302 is connected to an inductor 304 at a first end. For example, the inductor may be a single inductor associated with the pulser circuit 104. The inductor is connected to a first node 306 at a second end. The pulser circuit 300 further includes a second node 308. A plurality of capacitors and corresponding light emitters (e.g., laser diodes) are connected in parallel between the first node 306 and the second node 308 through diodes 310, 318, 326, and 334, respectively.

Alternative portions of the environment 200 may be avoided by the LIDAR device as well. These may be aspects of the environment detected by the LIDAR device or other sensors (e.g, the sensors 112). For example, a GPS device may indicate a location of the LIDAR device. The location of the LIDAR device may be associated with known static objects that are highly reflective, and which may cause interference with reflections received from other objects in the environment. Based on this information, the LIDAR device may avoid emitting light towards the known static objects. In other examples where the LIDAR device is mounted to a vehicle, the LIDAR device may avoid emitting light towards a detected surface of the vehicle (e.g., a hood or trunk of the vehicle). Other examples are possible. The example depicted in FIG. 2 is referenced below for illustrative purposes.

In FIG. 3A, four sets of capacitors and corresponding light emitters are depicted. However, it should be understood that more or fewer sets can be used. An anode end of a first diode 310 is connected to the first node 306 and a cathode end of the first diode 310 is connected to a first common node. An anode end of a first light emitter 312 (depicted as a light-emitting diode) is connected to the first common node and a cathode end of the first light emitter 312 is connected to the second node 308. A first end of a first capacitor 314 is connected to the first common node and a second end of the first capacitor 314 is connected to ground. The first common node is connected to a shift register 344. The shift register 344 may include a plurality of discharge-control transistors 350, 352, 354, and 356. In other examples, an output of the shift register 344 can be connected to gate of the discharge-control transistors 350, 352, 354, and 356. Discharge-control transistor 350 is associated with the first capacitor 314 at the first common node and is configured to selectively discharge the first capacitor 314 based on an output of the shift register 344.

Within examples, the shift register 344 may be loaded with N bits of data (e.g., corresponding to N capacitors and N corresponding light emitters, or corresponding to as many as 2^N capacitors and 2^N corresponding light emitters depending on how the shift register 344 is configured) using a digital input to the shift register, and each bit of data may control a state of a discharge-control transistor. For example, a "1" may indicate that a discharge-control transistor is to be turned on and a "0" may indicate that a discharge-control transistor is to remain off, or vice versa. Further, as noted above, discharge-control transistors 350, 352, 354, and 356 can be more generally referred to as "switches," and correspondingly, other switching devices could be used and operate similarly to discharge-control transistors 350, 352, 354, and 356 as described herein. Within examples, the discharge-control transistors are controlled directly by a LIDAR controller, such as controller 116. Other implementations are possible.

An anode end of a second diode 318 is connected to the first node 306 and a cathode end of the second diode 318 is connected to a second common node. An anode end of a second light emitter 320 (depicted as a photodiode) is connected to the second common node and a cathode end of the second light emitter 320 is connected to the second node 308. A first end of a second capacitor 322 is connected to the second common node and a second end of the second capacitor 322 is connected to ground. The second common node is connected to the shift register 344. The shift register 344 may include or be connected to a discharge-control transistor associated with the second capacitor 322 at the second common node. In particular, discharge-control transistor 352 is associated with the second capacitor 322 at the second common node and is configured to selectively discharge the second capacitor 322 based on an output of shift register 344.

An anode end of a third diode 326 is connected to the first node 306 and a cathode end of the third diode 326 is connected to a third common node. An anode end of a third light emitter 328 (depicted as a light-emitting diode) is connected to the third common node and a cathode end of the third light emitter 328 is connected to the second node 308. A first end of a third capacitor 330 is connected to the third common node and a second end of the third capacitor 330 is connected to ground. The third common node is connected to a shift register 344. The shift register 344 may include or be connected to a discharge-control transistor associated with the third capacitor 330 at the third common node. In particular, discharge-control transistor 354 is associated with the third capacitor 330 at the third common node and is configured to selectively discharge the third capacitor 330 based on an output of shift register 344.

An anode end of a fourth diode 334 is connected to the first node 306 and a cathode end of the fourth diode 334 is connected to a fourth common node. An anode end of a fourth light emitter 336 (depicted as a light-emitting diode) is connected to the fourth common node and a cathode end of the fourth light emitter 336 is connected to the second node 308. A first end of a fourth capacitor 338 is connected to the fourth common node and a second end of the fourth capacitor 338 is connected to ground. The fourth common node is connected to a shift register 344. The shift register 344 may include or be connected to a discharge-control transistor associated with the fourth capacitor 338 at the fourth common node. In particular, discharge-control transistor 356 is associated with the fourth capacitor 338 at the fourth common node and is configured to selectively discharge the fourth capacitor 338 based on an output of shift register 344.

Within examples, cathode ends of the first light emitter 312, second light emitter 320, third light emitter 328, and fourth light emitter 336 share a common cathode which forms the second node 308. For example, a unitary device (such as a chip or printed circuit board, may include each of the light emitters). The second node 308 is connected to a pulse-control transistor 348 (depicted as a field effect transistor (FET), such as a MOSFET) at a drain end. The pulse-control transistor 348 is connected to ground at a source end. A gate of the pulse-control transistor 348 is controlled by a FET driver 346. The FET driver may be configured to operationally bias the pulse-control transistor 348 based on control instructions such that the pulse-control transistor 348 promotes current flow or restricts current flow (e.g., such that little or no current flows from the second node 308 to ground). In other examples, an alternative to a transistor, such as a switch, can be used.

Also shown in FIG. 3A are a plurality of currents "I1" flowing through the respective diode and charging the respective capacitors or each set. This occurs at a first time at which the voltage source node 302 provides a voltage input to the inductor 304, which in turn provides a voltage at the first node 306. The FET driver 346 controls the pulse-control transistor 348 so that it restricts current flow from the second node 308 to ground. Similarly, the discharge-control transistors associated with shift register 344 restrict current flow at the first time. In turn, this causes the current I1 (which may vary slightly based on each diode and capacitor) to flow from the first node 306 to the capacitors, causing the capacitors to charge.

Voltage indicators 316, 324, 332, and 340 are depicted in FIG. 3A for illustrative purposes, and correspond to capacitors 314, 322, 330, and 338 respectively. The voltage indicators show a relative voltage level "Vcap" of each capacitors at different times. At the first time, each capacitor has zero or minimal charge because the input voltage node 302 has just begun to provide a voltage.

Figure 3B:
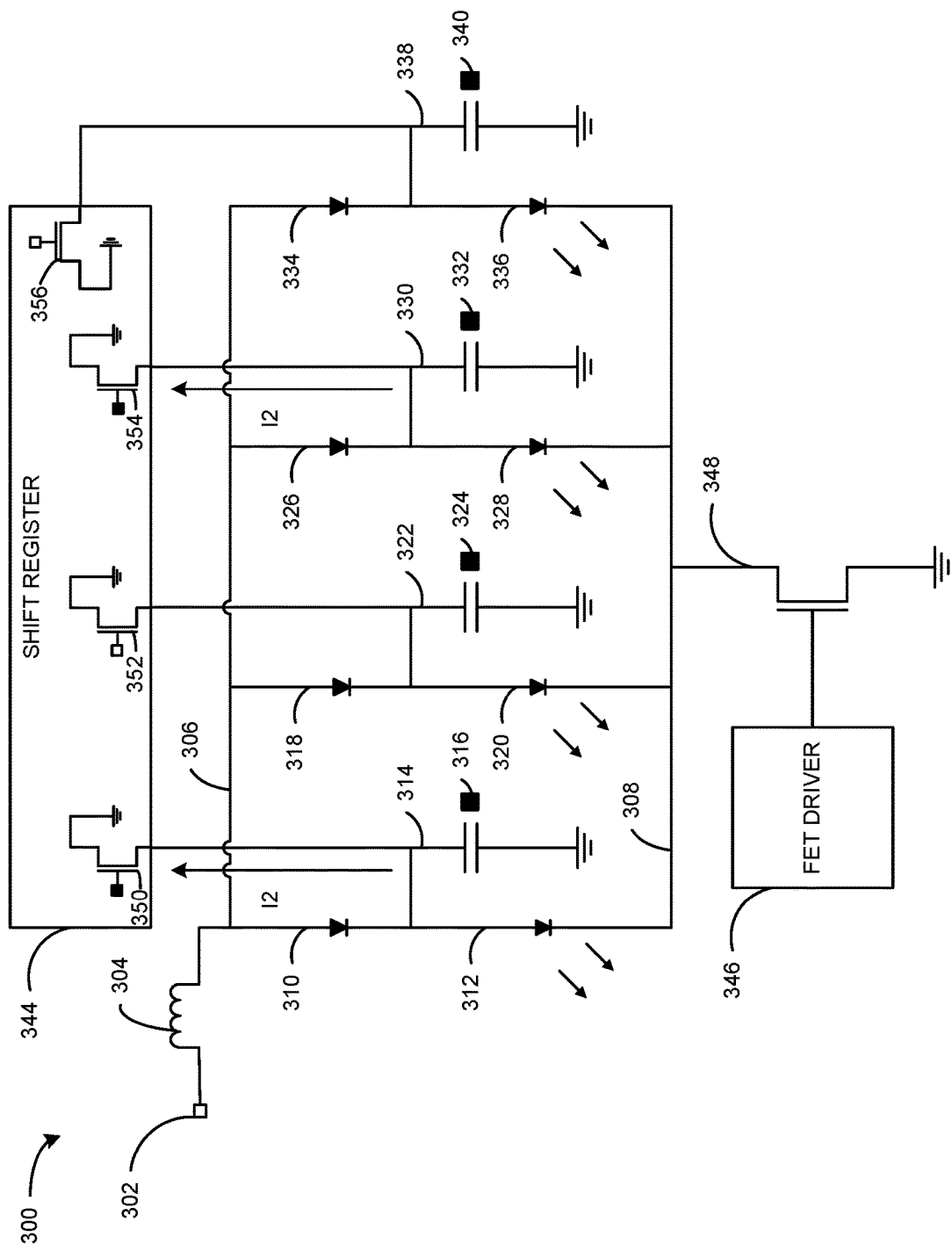
FIG. 3B illustrates a pulser circuit of a LIDAR device at a second time, according to an example embodiment.

FIG. 3B illustrates a pulser circuit of a LIDAR device at a second time, according to an example embodiment. In particular, FIG. 3B shows a different state of the pulser circuit 300 as shown in FIG. 3A and described above. The second time might be the end of a first period that spans the first time to the second time. The second time may also correspond to the beginning of a second period. The first period and the second period may be portions of a repeating pulse period of the pulser circuit 300.

At the second time, each capacitor has been charged, as shown by voltage indicators 316, 324, 332, and 340. Though these indicate a maximum Vcap has been reached, depending on a voltage level at the first node 306 and a time taken to charge the capacitors, a different voltage may be reached. For example, in a default mode of operation, an adjustable voltage source connected to the voltage source node 302 may be controlled to apply a voltage V1 to the inductor 304, which causes each of the capacitors to charge up to a voltage of Vcap1 (e.g., Vcap1 could be about 2×V1). When the capacitors discharge through their respective laser diodes, as described further below, the emitted light pulses may have a first peak power level. However, for relatively short periods of time (e.g., based on thermal constraints), the adjustable voltage source may be controlled to apply a voltage V2 to the inductor in which V2>V1. This causes the capacitors to charge up to a higher voltage, Vcap2 (e.g., Vcap2 could be about 2×V2). Thus, when the capacitors discharge through their respective laser diodes, the emitted light pulses may have a second, higher peak power level. In this manner, the pulser circuit 300 can be controlled to emit light from the light emitters at different intensities, which can allow for more nuanced control of the LIDAR device. For example, increased light intensities may be used where the environment is relatively bright (e.g., based on other light sources in the environment), while lower light intensities can be used in low-light conditions (e.g., at night) to conserve energy usage.

In additional or alternative examples, controlling the voltage levels of the capacitors may alternatively or additionally involve applying a voltage for a period of time associated with charging the capacitor. For example, a desired power level of a light pulse can be determined that is associated with a charge level of the capacitors. The capacitors may be charged for a period of time (e.g., based on a known capacitance of the capacitors and the applied voltage) associated with the power level. Because the capacitance of each capacitor is predetermined and a voltage output at the first node 306 is known (e.g., controlled to be at a particular voltage level), charging characteristics of each capacitor can be used to accurately set the charge level of the capacitors. For example, a time constant can be determined and used to calculate a charging time for the capacitors. In this manner, a power level of each light pulse can be precisely controlled by setting the charging period for the capacitors. Additionally or alternatively, each charged capacitor can be discharged by a predetermined amount prior to the emission period to achieve a desired voltage level and thereby control a power level of each light pulse.

Turning back to FIG. 3B, a plurality of currents "I2" are shown that correspond to capacitors 314 and 330. This is caused using discharge-control transistors 350 and 354 corresponding to capacitors 314 and 330, as shown in shift register 344 of FIG. 3B. As noted above, in other implementations, these transistors may exist separately from the shift register 344 and operate based on outputs of the shift register. Thus, at the second time, all of the capacitors are charged and capacitors 314 and 330 have been selected for discharging. Further, because the FET driver 346 controls the pulse-control transistor 348 so that it restricts current flow from the second node 308 to ground, zero or minimal current flows through the light emitters at the second time.

Discharging capacitors 314 and 330 corresponds to not emitting light (or emitting a relatively low level of light) from light emitters 312 and 328 respectively. Using FIG. 2 as a reference scenario for illustrative purposes, based on a status of a LIDAR device that includes the light emitters (e.g., a location of the LIDAR device), and based on regions of the environment that the LIDAR device is avoiding (e.g., regions 228 and 230 corresponding to retroreflector 216 and retroreflective strip 220), some light detectors might be "turned off" for a given pulse period to avoid emitting light towards the regions of the environment that the LIDAR device is avoiding. For example, the LIDAR device (or another device, such as the system controller 102) may determine which light emitters are scheduled to emit light towards the avoided regions, and select corresponding capacitors for discharging so that those light emitters do not emit light. In the present example, this includes discharging capacitors 314 and 330 so that light emitters 312 and 328 do not emit light so that the LIDAR device does not illuminate regions 228 and 230. As referred to below with respect to FIG. 4, this process may involve determining a portion of an environment to illuminate using the light emitters and a remaining portion. The remaining portion may correspond to regions that the LIDAR device avoids illuminating with one or more light emitters.

Figure 3C:
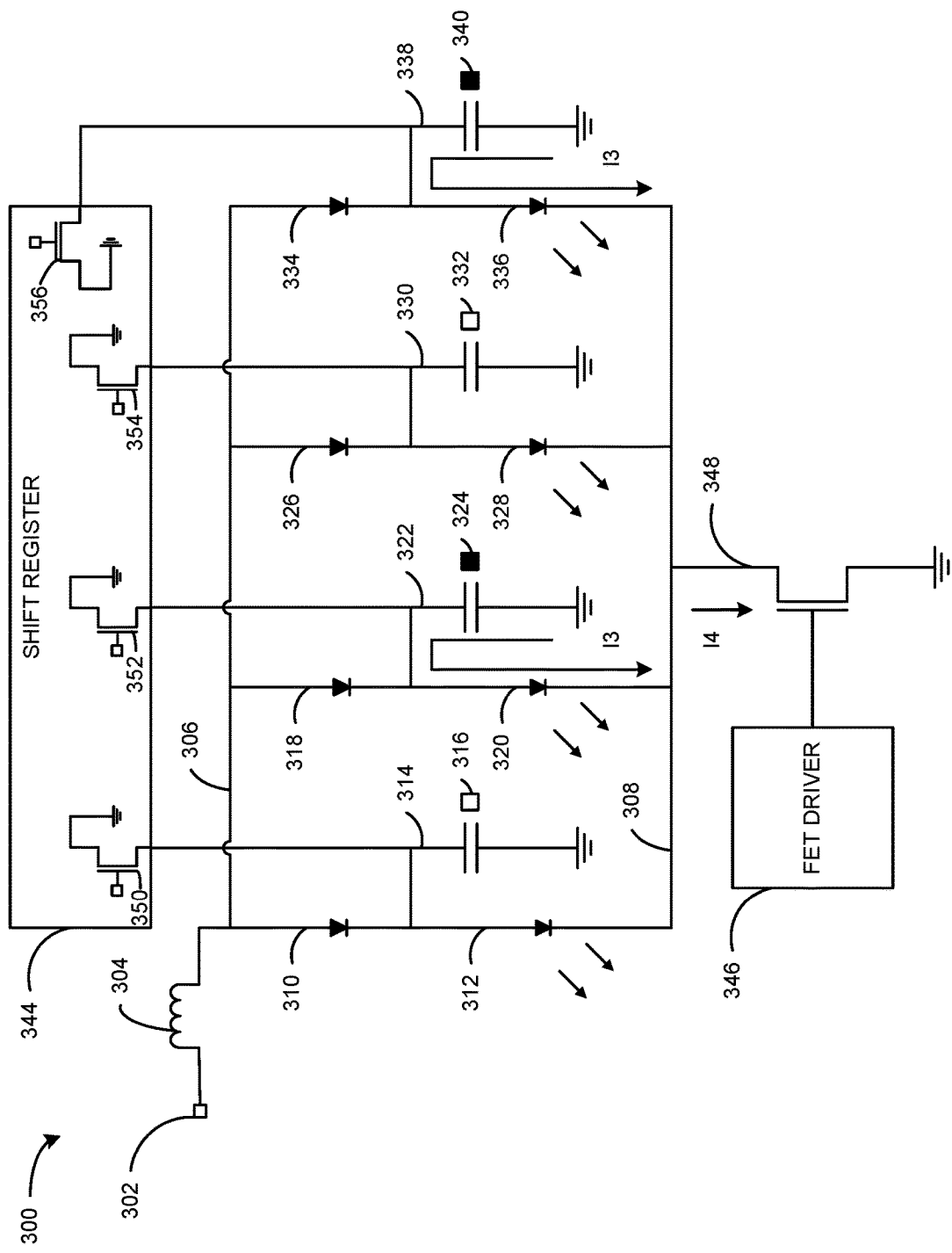
FIG. 3C illustrates a pulser circuit of a LIDAR device at a third time, according to an example embodiment.

FIG. 3C illustrates a pulser circuit of a LIDAR device at a third time, according to an example embodiment. In particular, FIG. 3C shows a different state of the pulser circuit 300 as shown in FIGS. 3A and 3B and described above. The third time might be the end of a second period that spans the second time to the third time. The third time may also correspond to the beginning of a third period. The second period and the third period may be portions of a repeating pulse period of the pulser circuit 300.

As shown by voltage indicators 316 and 332 corresponding to capacitors 314 and 330 respectively have zero or minimal voltage as a result of being discharged during the second period. Also shown are a plurality of currents "I3" from capacitors 322 and 338 to the second node 308 and current "I4" from the second node to ground. At the third time, the FET driver 346 controls the pulse-control transistor 348 so that it promotes current flow from the second node 308 to ground, the currents I3 and I4 are permitted to flow across light emitters 312 and 336 from corresponding capacitors 322 and 338, thereby causing light emitters 312 and 336 to emit light. Returning again to FIG. 2 for illustrative purposes, light emitters 312 and 336 may be directed to portions of the environment other than regions 222, 224, 226, 228, and 230, and thus correspond to the portion of the environment illuminated using the light emitters.

Figure 3D:
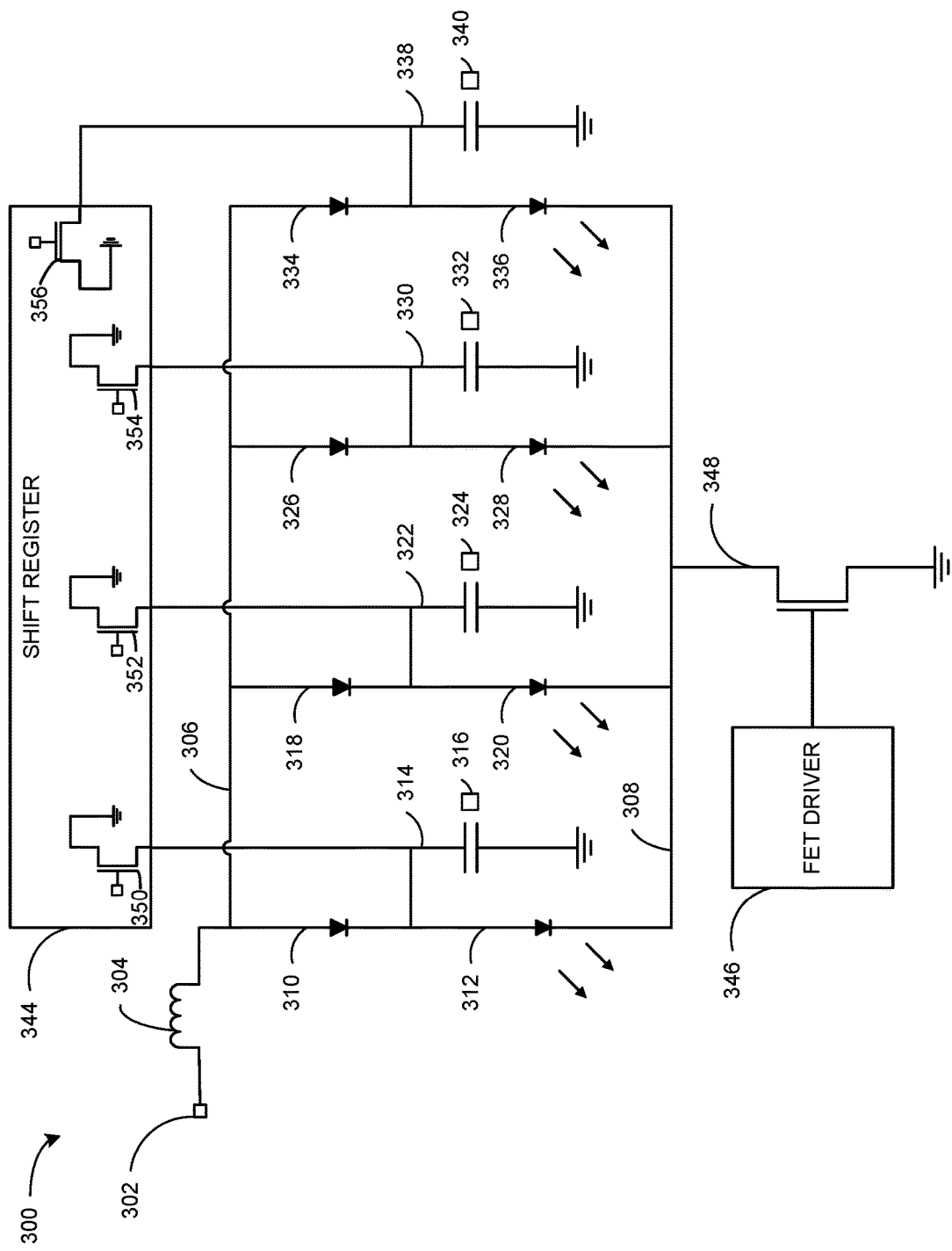
FIG. 3D illustrates a pulser circuit of a LIDAR device at a fourth time, according to an example embodiment.

FIG. 3D illustrates a pulser circuit of a LIDAR device at a fourth time, according to an example embodiment. In particular, FIG. 3D shows a different state of the pulser circuit 300 as shown in FIGS. 3A, 3B, and 3C and described above. The fourth time might be the end of a third period that spans the third time to the fourth time. The third period may be a portion of a repeating pulse period of the pulser circuit 300. In other examples, a latent period may extend from the fourth time to a beginning time of another pulse period, depending on scanning frequencies of the LIDAR device. As shown in voltage indicators 316, 324, 332, and 338, after the third time, each of the capacitors is discharged and the pulser circuit 300 can begin another pulse period during which different light emitters might be selection for emitting light or not emitting light depending on a status of the LIDAR device and/or the surrounding environment.

III. Example Methods

Figure 4:
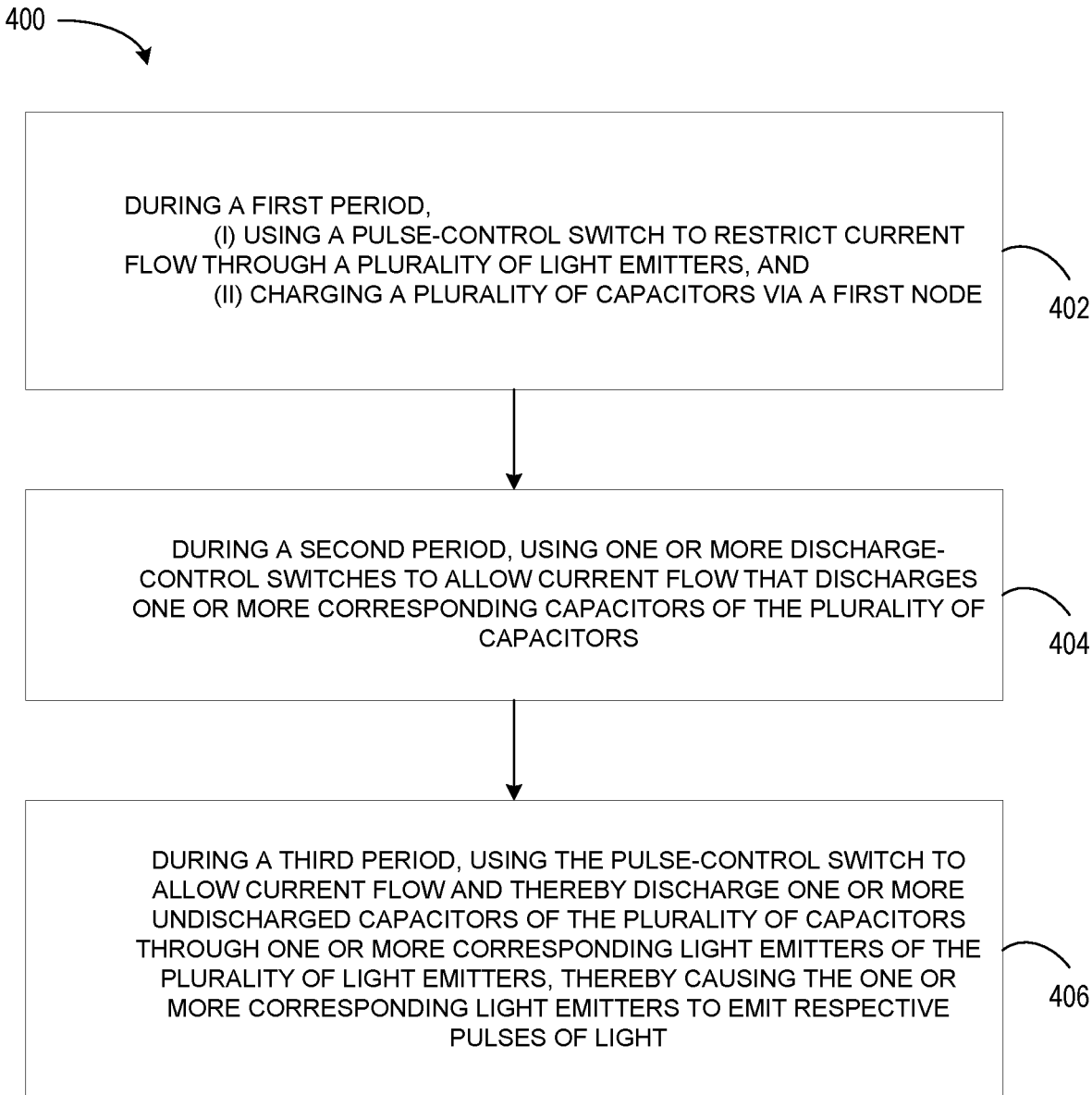
FIG. 4 is a block diagram of a method, according to an example embodiment.

FIG. 4 is a block diagram of a method, according to an example embodiment. In particular, FIG. 4 depicts a method 400 for use in selectively emitting light from a plurality of light emitters. Method 400 may be implemented in accordance with system 100, the pulser circuit 300 or the description thereof. For example, aspects of the functions of method 400 may be performed by system controller 102, controller 116, or by logical circuitry configured to implement the functions described above with respect to FIGS. 1A, 1B, 2, 3A, 3B, 3C, and 3D.

At block 402, method 400 includes, during a first period (e.g., between the first time and the second time shown in FIGS. 3A and 3B respectively), (i) using a pulse-control switch to restrict current flow through a plurality of light emitters, and (ii) charging a plurality of capacitors via a first node. This may be performed in accordance with FIGS. 3A, 3B, and corresponding description thereof.

At block 404, method 400 includes, during a second period (e.g., between the second time and the third time shown in FIGS. 3B and 3C respectively), using one or more discharge-control switches to allow current flow that discharges one or more corresponding capacitors of the plurality of capacitors. This may be performed in accordance with FIGS. 3B, 3C, and corresponding description thereof.

At block 406, method 400 includes, during a third period (e.g., between the third time and the fourth time shown in FIGS. 3C and 3D respectively), using the pulse-control switch to allow current flow and thereby discharge one or more undischarged capacitors of the plurality of capacitors through one or more corresponding light emitters of the plurality of light emitters, thereby causing the one or more corresponding light emitters to emit respective pulses of light. This may be performed in accordance with FIGS. 3B, 3C, and corresponding description thereof.

Within examples, method 400 further includes determining a portion of an environment to illuminate using the light emitters and a remaining portion. For example, in a default state of a LIDAR device, this may include an entire field of view associated with a range of motion of light emitters in the LIDAR device. In other states, such as that depicted in FIG. 2, this may involve a majority of the environment minus some regions that the LIDAR device avoids. In these examples, method 400 includes determining one or more light emitters corresponding to the remaining portion of the environment at an emission time (e.g., light emitters 312 and 332). In such examples block 404 involves using the one or more discharge-control switches to allow current flow and thereby discharge the one or more light emitters corresponding to the remaining portion of the environment. In this manner, method 400 allows illuminating select portions of the environment. As an example of these embodiments, determining the portion of an environment to illuminate using the light emitters and the remaining portion includes emitting light using the light emitters during a first scan of the environment (e.g., as described above with respect to FIG. 2), receiving reflected portions of the emitted light corresponding to the first scan, and determining, based on the received reflected portions of emitted light, not to emit light towards the remaining portion of the environment during a second scan of the environment. For example, this may correspond to not emitting light towards regions 222, 224, 226, 228, and 230 depicted in FIG. 2. In still further examples, method 400 may include identifying, based on the received reflected portions of emitted light, a type of object in the environment (e.g., a retroreflector). In such examples determining not to emit light towards the remaining portion of the environment during the second scan of the environment includes determining not to emit light towards the type of object in the environment. For example, the region may be determined based on identifying a portion of a field of view of the LIDAR device corresponding to the retroreflectors in the first scan, determining a buffer region (e.g., 6 inches) around the identified retroreflectors, and not emitting light within portion of the fields of view and/or the buffer region.

Within examples in which the one or more discharge-control switches correspond to outputs from a shift register, block 404 may include using the one or more discharge-control switches to allow current flow and thereby discharge one or more of the plurality of capacitors, comprises using a plurality of bits input into the shift register to designate which of the plurality of capacitors is discharged during the second period and which of the plurality of capacitors are undischarged during the second period.

Within examples in which the method is implemented using a LIDAR device (e.g., the LIDAR device 110), method 400 can further include determining an expected change in pose of the LIDAR device from a first scan of the LIDAR device to a second scan of the LIDAR device. For example, if the LIDAR is coupled to a vehicle, a controller of the vehicle (e.g., system controller 102) may determine a velocity of the vehicle and determine where the LIDAR device will be during the second scan. In such examples, block 404 further includes selecting the one or more of the plurality of capacitors for discharging based on the expected change in pose of the LIDAR device from the first scan of the LIDAR device to the second scan of the LIDAR device. For example, the expected pose may influence which light emitter is scheduled to illuminate a region that the LIDAR device should avoid illuminating.

Within examples, method 400 may be performed multiple times in succession, with different light emitters being selected for emitting light and not emitting light in different iterations. In this manner the systems and methods described herein may adapt to changing conditions in the environment or different instructions received, for example, from the system controller 102. For example, the first period, the second period, and the third period are included within a first pulse period of a plurality of repeating pulse periods associated with the plurality of light emitters. And, during a second pulse period of the plurality of pulse periods the first, second, and third periods may be performed again using different light emitters. Namely, during the first period of the second pulse period, method 400 includes (i) using the pulse-control switch to restrict current flow through a plurality of light emitters, and (ii) charging the plurality of capacitors via a first node. Further, during the second period of the second pulse period, method 400 includes using the one or more discharge-control switches to allow current flow and thereby discharge one or more different capacitors of the plurality of capacitors. Additionally, during the third period of the second pulse period, method 400 includes using the pulse-control switch to allow current flow and thereby discharge one or more different undischarged capacitors through one or more different light emitters causing the one or more different light emitters to emit respective pulses of light.

Though particular embodiments described herein show certain ways of charging and discharging capacitors within pulse periods as a way of selecting particular light emitters for emitting light or not emitting light, different ways of achieving this are possible. For example, different types of transistors or diodes can be used, or switches or other devices capable of imposing discrete states on a pulser circuit can be used in various implementations and within the contemplated scope of this disclosure. Further, though operations described herein refer to computing devices such as system controller 102, and controller 116, it should be understood that the functions described herein may be performed by either of these computing devices, both computing devices, or neither computing device. For example, logical circuitry and periodic timing circuits can be used to perform aspects of this disclosure by default or automatically. Further, though embodiments are described with a certain number of light emitters, it should be understood that substantially more light emitters (or, in other examples, fewer light emitters, such as one light emitter) may be included in a single pulser circuit depending on contexts of the system (e.g., some LIDAR devices can include a single light emitter, while others may include several). In other examples, several pulser circuits may run concurrently to drive all light emitters in a LIDAR device. Other examples are possible.

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, a physical computer (e.g., a field programmable gate array (FPGA) or application-specific integrated circuit (ASIC)), or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. A circuit comprising:
   a plurality of light emitters connected between a first node and a second node;
   a plurality of capacitors, wherein each capacitor in the plurality of capacitors corresponds to a respective light emitter in the plurality of light emitters; and
   a pulse-control switch connected to the plurality of light emitters,
      wherein, during a first period, the pulse-control switch restricts current flow and each capacitor in the plurality of capacitors is charged via the first node,
      wherein, during a second period, one or more capacitors of the plurality of capacitors are discharged, and
      wherein, during a third period, the pulse-control switch allows current flow that discharges one or more undischarged capacitors of the plurality of capacitors through one or more corresponding light emitters of the plurality of light emitters, thereby causing the one or more corresponding light emitters to emit respective pulses of light.

2. The circuit of claim 1, wherein the pulse-control switch comprises a field-effect transistor.

3. The circuit of claim 1, wherein the plurality of light emitters comprises a plurality of laser diodes sharing a common cathode, and wherein the common cathode is connected to the pulse-control switch at the second node.

4. The circuit of claim 1, further comprising:
   a plurality of discharge-control switches, wherein each discharge control switch corresponds to a respective capacitor in the plurality of capacitors, and wherein, during the second period, the one or more capacitors discharged are discharged by one or more of the plurality of discharge-control switches allowing a discharging current flow; and
   a shift register configured to select individual capacitors from the plurality of capacitors, via corresponding discharge-control switches in the plurality of discharge-control switches, for discharging.

5. The circuit of claim 4, wherein the shift register is configured to receive a digital input comprising a plurality of bits, wherein each bit in the plurality of bits indicates whether a corresponding capacitor in the plurality of capacitors is discharged or undischarged during the second period.

6. The circuit of claim 1, further comprising a plurality of diodes connected between the first node and the plurality of capacitors, wherein each capacitor of the plurality of capacitors is charged via a corresponding diode of the plurality of diodes.

7. The circuit of claim 1, further comprising a driver circuit connected to the pulse-control switch and configured to bias the pulse-control switch to allow current flow during the third period.

8. The circuit of claim 1, wherein the first period, the second period, and the third period, occur within a repeating pulse period associated with the plurality of light emitters.

9. The circuit of claim 1, further comprising a single inductor connected to the first node, wherein the single inductor is configured to charge the plurality of capacitors during the first period.

10. The circuit of claim 1, further comprising an adjustable voltage source connected to the first node, wherein the plurality of capacitors are charged during the first period in accordance with a voltage level of the adjustable voltage source, and wherein the respective pulses of light emitted during the third period have a peak power level that is based on the voltage level.

11. A method comprising:
    during a first period,
       (i) using a pulse-control switch to restrict current flow through a plurality of light emitters, and
       (ii) charging a plurality of capacitors via a first node;
    during a second period,
       discharging one or more capacitors of the plurality of capacitors; and
    during a third period,
       using the pulse-control switch to allow current flow and thereby discharge one or more undischarged capacitors of the plurality of capacitors through one or more corresponding light emitters of the plurality of light emitters, thereby causing the one or more corresponding light emitters to emit respective pulses of light.

12. The method of claim 11, further comprising:
    determining a portion of an environment to illuminate using the light emitters and a remaining portion; and
    determining one or more light emitters corresponding to the remaining portion of the environment at an emission time,
    wherein the one or more capacitors discharged during the second period correspond to light emitters that correspond to the remaining portion of the environment.

13. The method of claim 12, wherein determining the portion of an environment to illuminate using the light emitters and the remaining portion comprises:
    emitting light using the light emitters during a first scan of the environment;
    receiving reflected portions of the emitted light corresponding to the first scan; and
    determining, based on the received reflected portions of emitted light, not to emit light towards the remaining portion of the environment during a second scan of the environment.

14. The method of claim 13, further comprising:
    identifying, based on the received reflected portions of emitted light, a type of object in the environment,
    wherein determining not to emit light towards the remaining portion of the environment during a second scan of the environment comprises determining not to emit light towards the type of object in the environment.

15. The method of claim 14, wherein the type of object is a retroreflector.

16. The method of claim 11,
wherein the one or more capacitors discharged during the second period are discharged using one or more corresponding discharge-control switches that allow discharging current flow,
wherein the one or more corresponding discharge-control switches correspond to outputs from a shift register, and
wherein using the one or more corresponding discharge-control switches to allow current flow and thereby discharge one or more of the plurality of capacitors, comprises using a plurality of bits input into the shift register to designate which of the plurality of capacitors is discharged during the second period and which of the plurality of capacitors are undischarged during the second period.

17. The method of claim 16, wherein the method is implemented using a LIDAR device, the method further comprising:
determining an expected change in pose of the LIDAR device from a first scan of the LIDAR device to a second scan of the LIDAR device,
wherein using the one or more discharge-control switches to allow current flow and thereby discharge one or more of the plurality of capacitors, comprises:
selecting the one or more of the plurality of capacitors for discharging based on the expected change in pose of the LIDAR device from the first scan of the LIDAR device to the second scan of the LIDAR device.

18. The method of claim 16, wherein the first period, the second period, and the third period are comprised within a first pulse period of a plurality of repeating pulse periods associated with the plurality of light emitters, the method further comprising:
during a second pulse period of the plurality of pulse periods:
during a first period of the second pulse period,
(i) using the pulse-control switch to restrict current flow through a plurality of light emitters, and
(ii) charging the plurality of capacitors via a first node;
during a second period of the second pulse period,
using the one or more discharge-control switches to allow current flow that discharges one or more different capacitors of the plurality of capacitors; and
during a third period of the second pulse period,
using the pulse-control switch to allow current flow and thereby discharge one or more different undischarged capacitors through one or more different light emitters, thereby causing the one or more different light emitters to emit respective pulses of light.

19. A non-transitory computer readable medium having instructions stored thereon that when executed by a processor cause performance of a set of functions, wherein the set of functions comprises:
during a first period,
(i) using a pulse-control switch to restrict current flow through a plurality of light emitters, and
(ii) charging a plurality of capacitors via a first node;
during a second period,
discharging one or more capacitors of the plurality of capacitors; and
during a third period,
using the pulse-control switch to allow current flow and thereby discharge one or more undischarged capacitors of the plurality of capacitors through one or more corresponding light emitters of the plurality of light emitters, thereby causing the one or more corresponding light emitters to emit respective pulses of light.

20. The non-transitory computer readable medium of claim 19, wherein the one or more capacitors discharged during the second period are discharged using one or more corresponding discharge-control switches that allow discharging current flow, and wherein the set of functions further comprise:
emitting light using the light emitters during a first scan of an environment;
receiving reflected portions of the emitted light corresponding to the first scan;
determining, based on the received reflected portions of emitted light, a portion of an environment to illuminate using the light emitters and a remaining portion; and
determining one or more light emitters corresponding to the remaining portion of the environment at an emission time,
wherein using the one or more discharge-control switches to allow current flow and thereby discharge the one or more of the plurality of capacitors comprises using the one or more discharge-control switches to allow current flow that discharges the one or more light emitters corresponding to the remaining portion of the environment.

* * * * *